United States Patent
Hamada et al.

(10) Patent No.: US 7,489,139 B2
(45) Date of Patent: Feb. 10, 2009

(54) SYSTEM AND METHOD FOR CHECKING DECOUPLING OF POWER SUPPLY IN PRINTED WIRING BOARD

(75) Inventors: Seiji Hamada, Osaka (JP); Hirotsugu Fusayasu, Uji (JP); Shoichi Mimura, Hirakata (JP); Miyoko Irikiin, Amagasaki (JP)

(73) Assignee: Panasonic Corporation, Osaka (JP)

( * ) Notice: Subject to any disclaimer, the term of this patent is extended or adjusted under 35 U.S.C. 154(b) by 469 days.

(21) Appl. No.: 10/557,989

(22) PCT Filed: Feb. 14, 2005

(86) PCT No.: PCT/JP2005/002135

§ 371 (c)(1), (2), (4) Date: Nov. 22, 2005

(87) PCT Pub. No.: WO2005/081143

PCT Pub. Date: Sep. 1, 2005

(65) Prior Publication Data

US 2007/0052439 A1 Mar. 8, 2007

(30) Foreign Application Priority Data

Feb. 25, 2004 (JP) .............................. 2004-049453

(51) Int. Cl.
*G01R 31/00* (2006.01)
*G01R 31/02* (2006.01)

(52) U.S. Cl. ........................ 324/537; 324/500; 716/5; 716/15

(58) Field of Classification Search ................. 324/500, 324/537; 716/5, 15
See application file for complete search history.

(56) References Cited

U.S. PATENT DOCUMENTS

| 6,323,050 | B1 | 11/2001 | Dansky et al. | |
| 6,477,694 | B1 * | 11/2002 | Irino et al. | 716/15 |
| 2002/0017907 | A1 | 2/2002 | Araki et al. | |
| 2004/0030511 | A1 | 2/2004 | Tien et al. | |
| 2006/0190892 | A1 * | 8/2006 | Haridass et al. | 716/10 |

FOREIGN PATENT DOCUMENTS

| EP | 0 901 088 | 3/1999 |
| JP | 2002-15023 | 1/2002 |
| JP | 2002-16337 | 1/2002 |

\* cited by examiner

*Primary Examiner*—Timothy J Dole
*Assistant Examiner*—Amy He
(74) *Attorney, Agent, or Firm*—Wenderoth, Lind & Ponack, L.L.P.

(57) ABSTRACT

A checking unit includes a power net extractor for extracting a power net with power attribution, which is segmented by a power-decoupling element, with reference to circuit design data of a printed wiring board; a parts number extractor for extracting a parts number of an integrated circuit connected to the extracted power net; a parts headcount calculator for calculating a headcount of the extracted parts; a judging unit for comparing the extracted parts headcount with a predetermined reference value; and a representing unit for representing a name of the power net and the parts number of the integrated circuit as an unprocessed location of power decoupling when the headcount is larger than the reference value, thereby inspecting quickly whether a power supply in use, shared by each of the integrated circuits, is decoupled at higher frequencies by the power-decoupling element.

9 Claims, 3 Drawing Sheets

| NET NAME | NET ATTRIBUTION | PARTS NUMBER | PIN NUMBER |
|---|---|---|---|
| NET001 | POWER | IC001 | 10 |
| NET001 | POWER | L0033 | 1 |
| NET002 | GROUND | R002 | 2 |
| NET003 | SIGNAL | IC001 | 15 |
| NET004 | POWER | IC005 | 23 |
| NET004 | POWER | C0022 | 2 |
| ⋮ | ⋮ | ⋮ | ⋮ |

| POWER NET NAME | HEADCOUNT (IC+ CONNECTOR) | JUDGMENT | CONNECTED PARTS |
|---|---|---|---|
| A | 2 | NG | IC001, IC002 |
| B | 1 | OK | IC003 |
| C | 1 | OK | IC002 |
| D | 1 | OK | IC004 |
| E | 2 | NG | IC003, IC005 |
| F | 2 | NG | IC004, CONNECTOR |

SYSTEM AND METHOD FOR CHECKING DECOUPLING OF POWER SUPPLY IN PRINTED WIRING BOARD

TECHNICAL FIELD

The present invention relates to EMC (electro-magnetic compatibility) design, in particular, a system and a method for checking decoupling of power supply in a printed wiring board to inspect whether a power line, which is connected to integrated circuits or connector parts, is decoupled at higher frequencies using a power-decoupling element.

BACKGROUND

In a printed wiring board provided with a high-speed integrated circuit, a through current, which is generated at a power supply terminal when the integrated circuit is switching, is one of factors of radiated noise or conducted noise. This is because the generated through current flows via a power wiring to form a long loop which can generate the radiated noise or an excitation source for resonance between a power plane and a ground plane. In addition, in a case in which the integrated circuits share a power source in use, a through current flowing from one circuit may be conducted to another circuit to exert an adverse affect on the latter. Furthermore, in another case in which the power wiring is connected to a connector, noise may spread out through the connector to other boards or may be radiated noise from a cable.

As a countermeasure against the through current generated at the power supply terminal of the integrated circuit, a decoupling capacitor is interposed between a power line and a ground around the power supply terminal so that the through current generated at the power supply terminal reflows into the ground around the power supply terminal, thereby eliminating propagation of RF energy on a power supply plane. Further, in a case in which a plurality of integrated circuits share a power source in use, it is known that the power source used for each of integrated circuits can be decoupled at higher frequencies using a power-decoupling element to avoid the above-described problem. Furthermore, the power-decoupling element is also around the power supply terminal of a connector to avoid noise spreading from the connector.

In recent years, however, integrated circuits have become more complicated and more sophisticated with a very large number of power terminals, and the number of the integrated circuits used on a printed wiring board may be several tens or more. Thus, it is not easy to check whether or not such countermeasure as describe above is adopted correctly in all cases.

Considering the above problem, as to existence and decision of both optimum interposed position and optimum capacitance of a decoupling capacitor interposed around a power supply terminal of an integrated circuit, for example, a checking method and a checking system disclosed in the following patent document 1 is known.

[Patent Document 1] JP-2002-16337-A

DISCLOSURE OF THE INVENTION

Problem to be Solved by the Invention

Manual and visual checking is carried out by viewing a circuit diagram to determine whether or not a power supply in use shared by each of plural integrated circuits is decoupled at higher frequencies and a power supply is decoupled on a power wiring of a connector, to revise an unprocessed location.

Accordingly, the checking process requires much time with possible slippage of detection, causing such a problem as described above due to slippage of detection at a stage of completion of the printed wiring board.

In light of the problem as described above, it is an object of the present invention to provide a system and a method for checking decoupling of power supply in a printed wiring board, which can inspect quickly without slippage of detection whether or not a power supply in use, which is shared by each of the integrated circuits, by each of the connectors or by both the integrated circuit and the connector, is decoupled at higher frequencies by a power-decoupling element.

Means for Solving the Problem

To attain the above object, a system for checking decoupling of power supply in a printed wiring board, according to the present invention, includes:

a power net extracting means for extracting a power net with power attribution, which is segmented by a power-decoupling element, with reference to circuit design data of the printed wiring board;

a parts number extracting means for extracting a parts number of an integrated circuit which is connected to the extracted power net;

a parts headcount calculating means for calculating a headcount of the integrated circuit which is connected to the extracted power net;

a judging means for comparing the extracted parts headcount with a predetermined reference value; and a representing means for representing a name of the power net and the parts number of the integrated circuit as an unprocessed location of power decoupling when the headcount is equal to or larger than the reference value.

It is preferable in the present invention that the parts number extracting means also extracts a parts number of a connector part which is connected to the extracted power net, and the parts headcount calculating means calculates the headcount in addition to a headcount of the connector parts which is connected to the extracted power net.

Further, it is preferable in the present invention that the power-decoupling element is an inductor, a coil, a high-frequency bead, a capacitor, a filtering element or a combination thereof.

Furthermore, it is preferable in the present invention that the predetermined reference value is two.

In Addition, a method for checking decoupling of power supply in a printed wiring board, according to the present invention, includes:

a power net extracting step for extracting a power net with power attribution, which is segmented by a power-decoupling element, with reference to circuit design data of the printed wiring board;

a parts number extracting step for extracting a parts number of an integrated circuit which is connected to the extracted power net;

a parts headcount calculating step for calculating a headcount of the integrated circuit which is connected to the extracted power net;

a discriminating step for comparing the extracted headcount with a predetermined reference value; and a representing step for representing a name of the power net and the parts number of the integrated circuit as an unprocessed location of power decoupling when the headcount is equal to or larger than the reference value.

It is preferable in the present invention that the parts number extracting means also extracts a parts number of a connector part which is connected to the extracted power net, and the parts headcount calculating means calculates the headcount in addition to a headcount of the connector parts which is connected to the extracted power net.

Further, it is preferable in the present invention that the power-decoupling element is an inductor, a coil, a high-frequency bead, a capacitor, a filtering element or a combination thereof.

Furthermore, it is preferable in the present invention that the predetermined reference value is two.

EFFECT OF THE INVENTION

According to the present invention, by referring to circuit design data of a printed wiring board, a power net which is segmented by a power-decoupling element is extracted, and a parts number of an integrated circuit which is connected to the power net is extracted, and then a headcount of the parts is calculated. In a case in which one power net is connected with one integrated circuit, decoupling of power supply of this power net can be judged OK. In another case, on the other hand, in which one power net is connected with a number of integrated circuits, decoupling of power supply of this power net can be judged no good, and then followed by representing each of the parts numbers of the integrated circuits as an unprocessed location of power decoupling to attract attention to a circuit designer.

Incidentally, a reference value for judging the parts headcount may be optionally set up based on high-frequency impedance of the power net, and in general, the power-decoupling element is preferably arranged so that one power net is connected with only one integrated circuit.

Further, by extracting a parts number of a connector part mounted on the printed wiring board, decoupling condition of power supply can be more reliably judged.

It is preferable in the present invention that the power-decoupling element is an inductor, a coil, a high-frequency bead, a capacitor, a filtering element or a combination thereof, thereby easily adopting a countermeasure for EMC of the printed wiring board.

DETAILED DESCRIPTION OF THE INVENTION

For easy understanding of the present invention, the present invention will be described below with reference to a preferred embodiment.

Embodiment 1

Figures 1, 2:
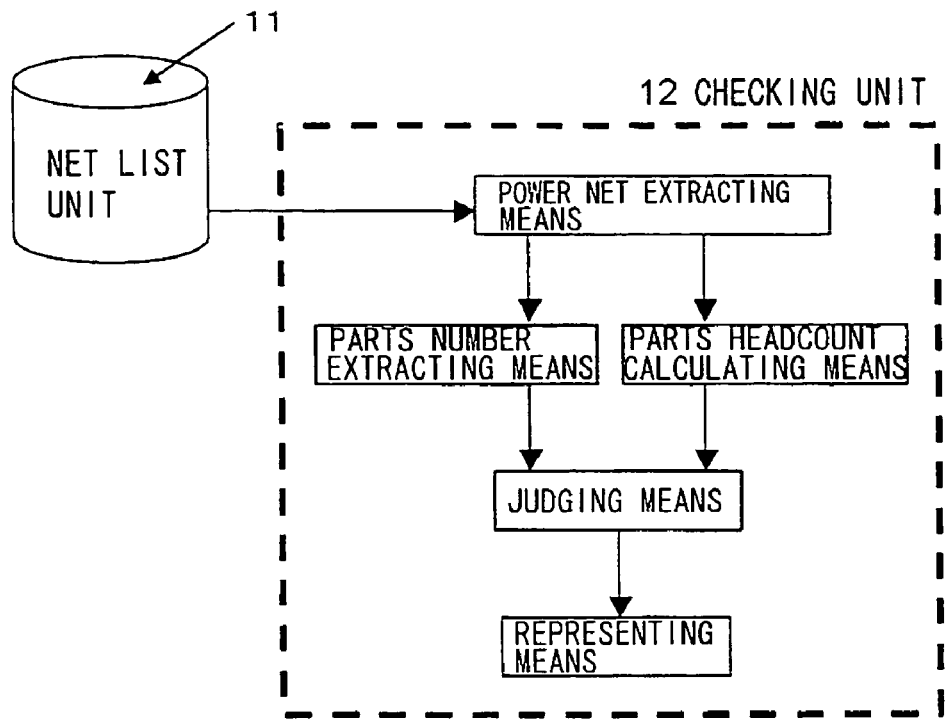
FIG. 1 is a functional block diagram showing configuration of a first embodiment according to the present invention.
FIG. 2 is an explanatory diagram showing an example of a circuit design database stored in a net list unit shown in FIG. 1.

FIG. 1 is a functional block diagram showing a configuration of a first embodiment according to the present invention.

A system for checking decoupling of power supply in a printed wiring board includes a checking unit 12 for judging decoupling condition of power supply of a printed wiring board with reference to circuit design data of the printed wiring board, which is stored in a net list unit 11, such as a data storage device.

The checking unit 12 can be configured of a computer including an operation processor, various hardware and various software. The checking unit 12 includes functionally a power net extracting means, a parts number extracting means, a parts headcount calculating means, a judging means and a representing means.

The power net extracting means extracts a power net with power attribution, which is segmented by a power-decoupling element, with reference to circuit design data of the printed wiring board, which is stored in the net list unit 11.

The parts number extracting means extracts a parts number of an integrated circuit which is connected to the power net extracted by the power net extracting means.

The parts headcount calculating means calculates a headcount of the integrated circuit which is connected to the power net extracted by the parts number extracting means.

The judging means compares the parts headcount, extracted by the parts headcount calculating means, with a predetermined reference value.

When the judging means judges that the headcount is equal to or larger than the reference value, the representing means represents a name of the power net and the parts number of the integrated circuit as an unprocessed location of power decoupling.

FIG. 2 is an explanatory diagram showing an example of a circuit design database stored in the net list unit 11. The circuit design database includes shapes and positions of patterns, such as a power line, a signal line and a ground line, which is formed on the printed wiring board, and species, shapes, orientations, positions and pin numbers of parts mounted on the printed wiring board, and pin numbers of parts connected to various lines. Here, for various line information, net name, that is a net identification code, and net attribution for identifying power, signal or ground are exemplified. And parts number and pin number of parts connected to a respective net are exemplified.

Figure 3:
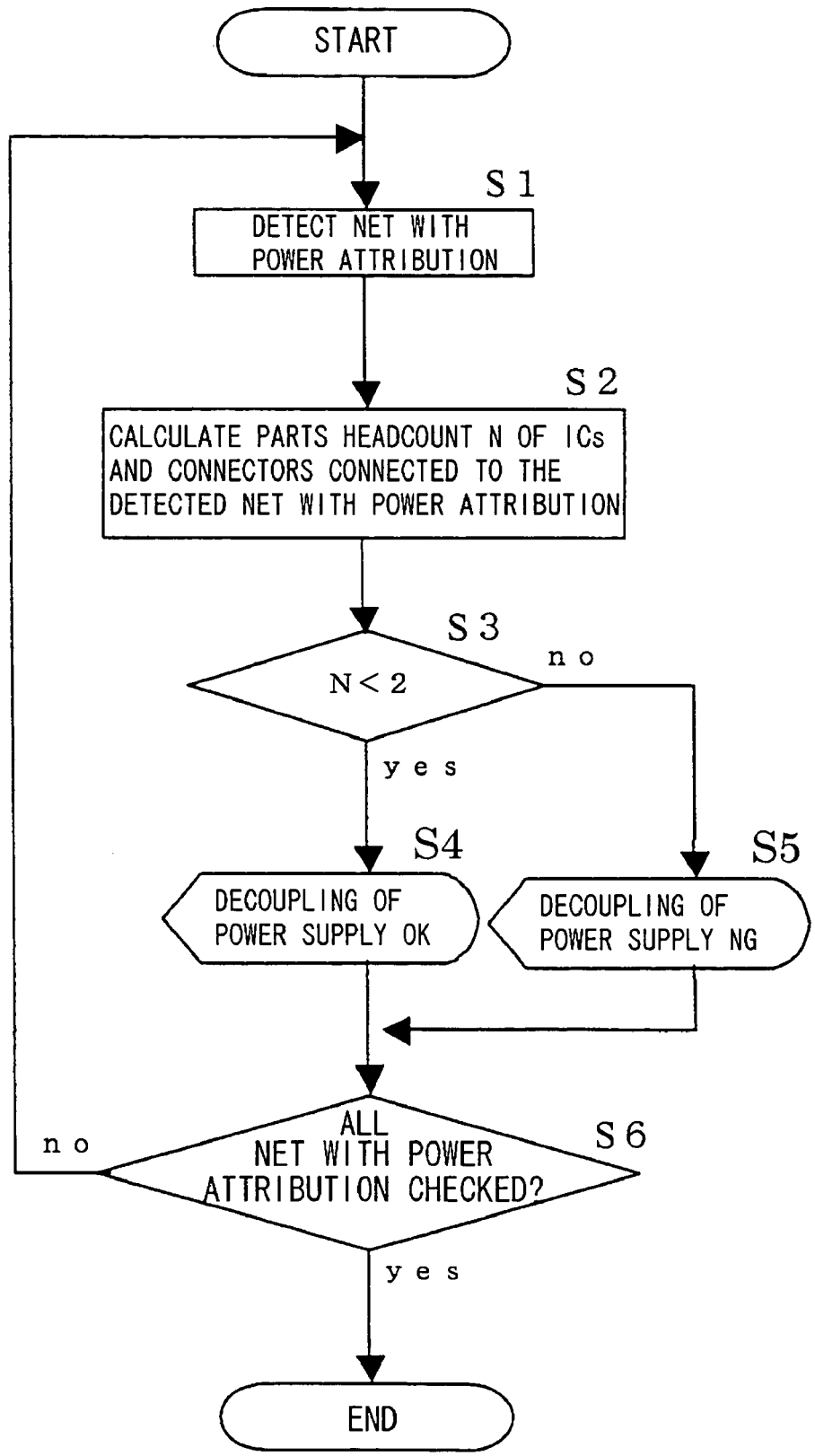
FIG. 3 is a flowchart showing an example of operation.
Figures 4, 5:
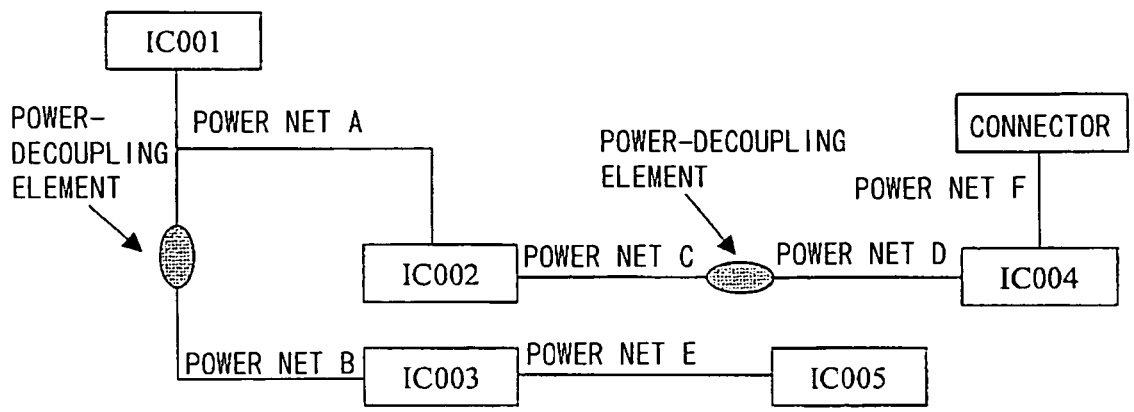
FIG. 4 is an explanatory diagram showing an example of power nets.
FIG. 5 is an explanatory diagram showing judging results of the power nets shown in FIG. 4.

FIG. 3 is a flowchart showing an example of operation. First, in a step s1, the power net extracting means extracts a power net with power attribution by referring to circuit design data which is stored in the net list unit 11. The power net, as shown in FIG. 4, functions for connecting an integrated circuit with another integrated circuit, or an integrated circuit with a connector, or a connector with another connector. In case a power-decoupling element is interposed in mid course, the net is segmented into two power nets.

Next, in a step s2, the parts number extracting means extracts a parts number of an integrated circuit which is connected to the power net extracted by the step s1. Next, the parts headcount calculating means calculates a parts headcount N of the extracted integrated circuits. In case of adopting a countermeasure for EMC of connector parts, a parts number of the connector parts is also extracted in the step s2 to add a headcount of the connector parts into the parts headcount N.

Next, in a step s3, the judging means compares the parts headcount N extracted by the step s2, with a predetermined reference value. The reference value is typically set up at '2' so that one power net is connected with either one integrated circuit or one connector. When the parts headcount N is smaller than the reference value '2', transferring to a step s4, the representing means represents a name of this power net, and the parts number of the integrated circuit connected to the power net on a display screen, together with a message like "decoupling of power supply OK." Incidentally, such a normal message may not be represented on the display screen to avoid redundancy.

Meanwhile, when the parts headcount N is equal to or larger than the reference value '2', transferring to a step s5, the representing means represents a name of this power net, and the parts number of the integrated circuit connected to the power net on the display screen, together with another message like "decoupling of power supply NG".

In a step s6, judging whether extraction of all the power nets of the circuit design database stored in the net list unit 11 is completed, and when uncompleted, jumping back to the step s1, another power net will be detected and a series of checking routine will be repeated. When all checking is completed, the checking routine is finished.

FIG. 4 is an explanatory diagram showing an example of power nets. On a printed wiring board mounted are parts IC001 to IC005 of integrated circuit and one connector part. The part IC001 and the part IC002 are directly connected to each other by a power net A. The power net A and the part IC003 are connected to each other through a power-decoupling element by a power net B. The part IC003 and the part IC005 are directly connected to each other by a power net E. The part IC002 and the part IC004 are connected to each other through another power-decoupling element by two power nets C and D. The parts IC004 and the connector are directly connected to each other by a power net F.

FIG. 5 is an explanatory diagram showing judging results of the power nets shown in FIG. 4. First, as to the power net A, since the parts headcount N in connection with the power net A is '2', the message "decoupling of power supply NG" and the parts number of the connected parts are represented.

As to the power net B, since the parts headcount N in connection with the power net B is '1', decoupling of power supply is judged normal. As to the power net C, since the parts headcount N in connection with the power net C is '1', decoupling of power supply is judged normal. As to the power net D, since the parts headcount N in connection with the power net D is '1', decoupling of power supply is judged normal.

As to the power net E, since the parts headcount N in connection with the power net E is '2', the message "decoupling of power supply NG" and the parts number of the connected parts are represented. As to the power net F, since the parts headcount N in connection with the power net F is '2', the message "decoupling of power supply NG" and the parts number of the connected parts are represented.

As described above, by inspection of the parts headcount in connection with each of the power nets, it can be easily judged whether decoupling at higher frequencies is attained correctly by the power-decoupling element.

INDUSTRIAL APPLICABILITY

According to the present invention, for EMC (electro-magnetic compatibility) design of a printed wiring board, it can be checked quickly whether or not a power line for connecting an integrated circuit or a connector part is decoupled at higher frequencies by a power-decoupling element.

The invention claimed is:

1. A system for checking decoupling of power supply in a printed wiring board, comprising:
    a power net extracting means for extracting a power net with power attribution, which is segmented by a power-decoupling element, with reference to circuit design data of the printed wiring board;
    a parts number extracting means for extracting a parts number of an integrated circuit which is connected to the extracted power net;
    a parts headcount calculating means for calculating a headcount of the integrated circuit which is connected to the extracted power net;
    a judging means for comparing the extracted parts headcount with a predetermined reference value; and
    a representing means for representing a name of the power net and the parts number of the integrated circuit as an unprocessed location of power decoupling when the headcount is equal to or larger than the reference value.

2. The system for checking decoupling of power supply in a printed wiring board, according to claim 1, wherein the parts number extracting means also extracts a parts number of a connector part which is connected to the extracted power net, and
    the parts headcount calculating means also calculates the headcount of the connector part which is connected to the extracted power net.

3. The system for checking decoupling of power supply in a printed wiring board, according to claim 1, wherein the power-decoupling element is an inductor, a coil, a high-frequency bead, a capacitor, a filtering element or a combination thereof.

4. The system for checking decoupling of power supply in a printed wiring board, according to claim 1, wherein the predetermined reference value is two.

5. A method for checking decoupling of power supply in a printed wiring board, including:
    a power net extracting step for extracting a power net with power attribution, which is segmented by a power-decoupling element, with reference to circuit design data of the printed wiring board;
    a parts number extracting step for extracting a parts number of an integrated circuit which is connected to the extracted power net;
    a parts headcount calculating step for calculating a headcount of the integrated circuit which is connected to the extracted power net;
    a discriminating step for comparing the extracted headcount with a predetermined reference value; and
    a representing step for representing a name of the power net and the parts number of the integrated circuit as an unprocessed location of power decoupling when the headcount is equal to or larger than the reference value.

6. The method for checking decoupling of power supply in a printed wiring board, according to claim 5, wherein the parts number extracting step also extracts a parts number of a connector part which is connected to the extracted power net, and
    the parts headcount calculating step also calculates the headcount of the connector part which is connected to the extracted power net.

7. The method for checking decoupling of power supply in a printed wiring board, according to claim 5 wherein the power-decoupling element is an inductor, a coil, a high-frequency bead, a capacitor, a filtering element or a combination thereof.

8. The method for checking decoupling of power supply in a printed wiring board, according to claim 5, wherein the predetermined reference value is two.

9. A recording media which is stored with a program for executing on a computer the method for checking decoupling of power supply in a printed wiring board, according to claim 5.

* * * * *